United States Patent [19]

Ferro et al.

[11] 4,257,058
[45] Mar. 17, 1981

[54] PACKAGE FOR RADIATION TRIGGERED SEMICONDUCTOR DEVICE AND METHOD

[75] Inventors: Armand P. Ferro, Schenectady; Victor A. K. Temple, Clifton Park, both of N.Y.

[73] Assignee: Electric Power Research Institute, Inc., Palo Alto, Calif.

[21] Appl. No.: 54,787

[22] Filed: Jul. 5, 1979

[51] Int. Cl.³ .......................................... H01L 27/14
[52] U.S. Cl. ...................................... 357/30; 357/38; 357/39; 357/74
[58] Field of Search ........................ 357/30, 38, 39, 74

[56] References Cited

U.S. PATENT DOCUMENTS

| | | | |
|---|---|---|---|
| 3,590,338 | 6/1971 | Roberts | 357/30 |
| 3,590,344 | 6/1971 | Roberts | 357/30 |
| 3,796,881 | 3/1974 | Roberts | 357/30 |
| 3,975,758 | 8/1976 | Schlegel | 357/74 |
| 3,991,460 | 11/1976 | Roberts | 29/578 |
| 4,003,074 | 1/1977 | Yonezu | 357/74 |
| 4,008,486 | 2/1977 | Byczkowski | 357/74 |
| 4,131,905 | 12/1978 | Hanes et al. | 357/30 |
| 4,186,409 | 1/1980 | McMullin | 357/38 |

*Primary Examiner*—Martin H. Edlow
*Attorney, Agent, or Firm*—Flehr, Hohbach, Test, Albritton & Herbert

[57] ABSTRACT

The invention is a package for radiation triggered semiconductor devices and a method for directing radiation to the radiation receiving region of a semiconductor device mounted in such a package. The package is of the type which has a side wall formed of an electrically insulating material surrounding a central cavity, and top and bottom walls formed of conductive material. The package is hermetically sealable and constructed to withstand externally applied compression. The means and method for radiation triggering of a semiconductor device in the package include optical conduit means extending through and hermetically sealed to the insulating side wall of the enclosure. Radiation is caused to enter the package along a first optical path in said optical conduit means. A prism or other similar means in the cavity redirects the radiation from the first optical path toward a predetermined region in the cavity to trigger a radiation triggered semiconductor device mounted in the package.

13 Claims, 4 Drawing Figures

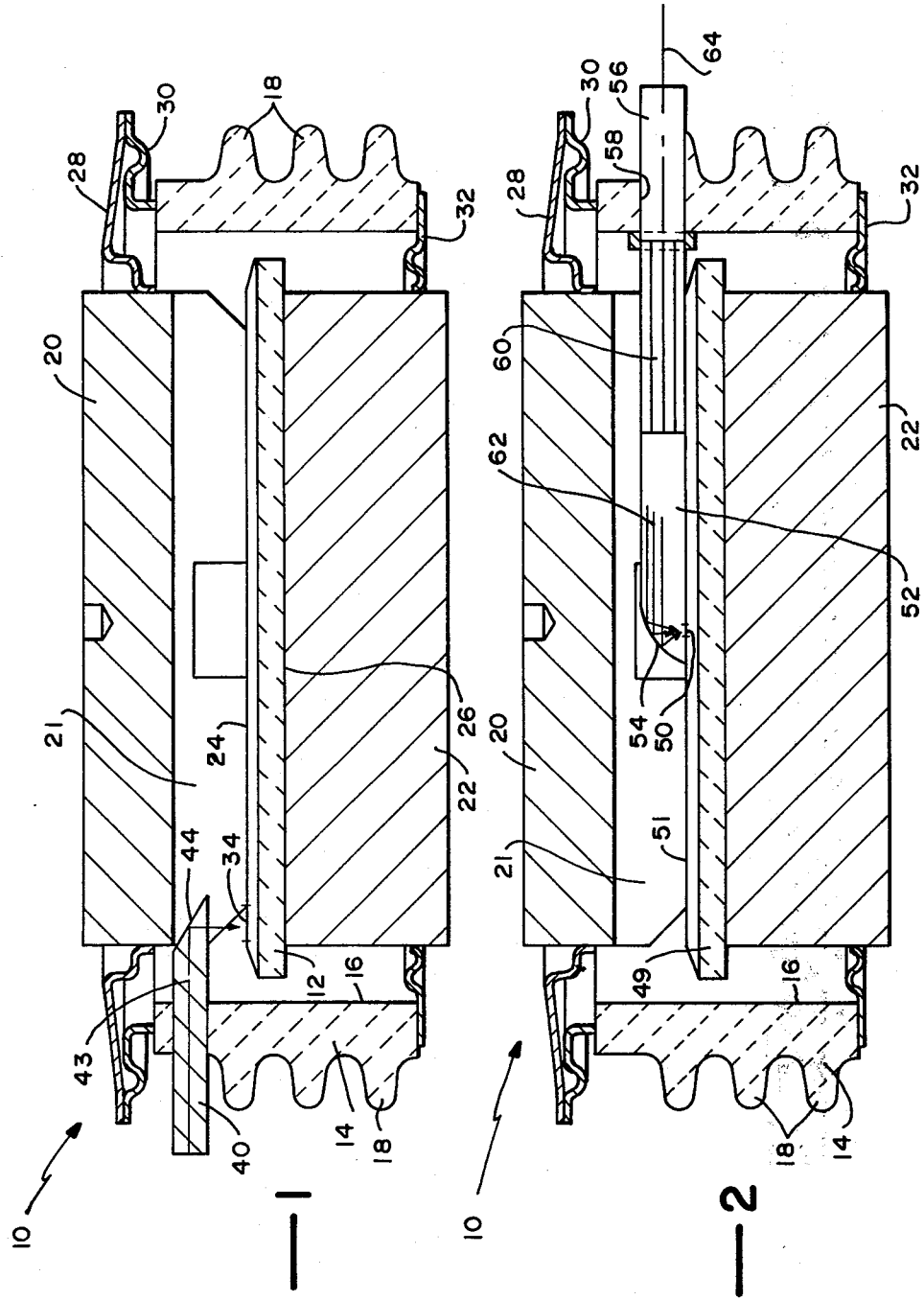

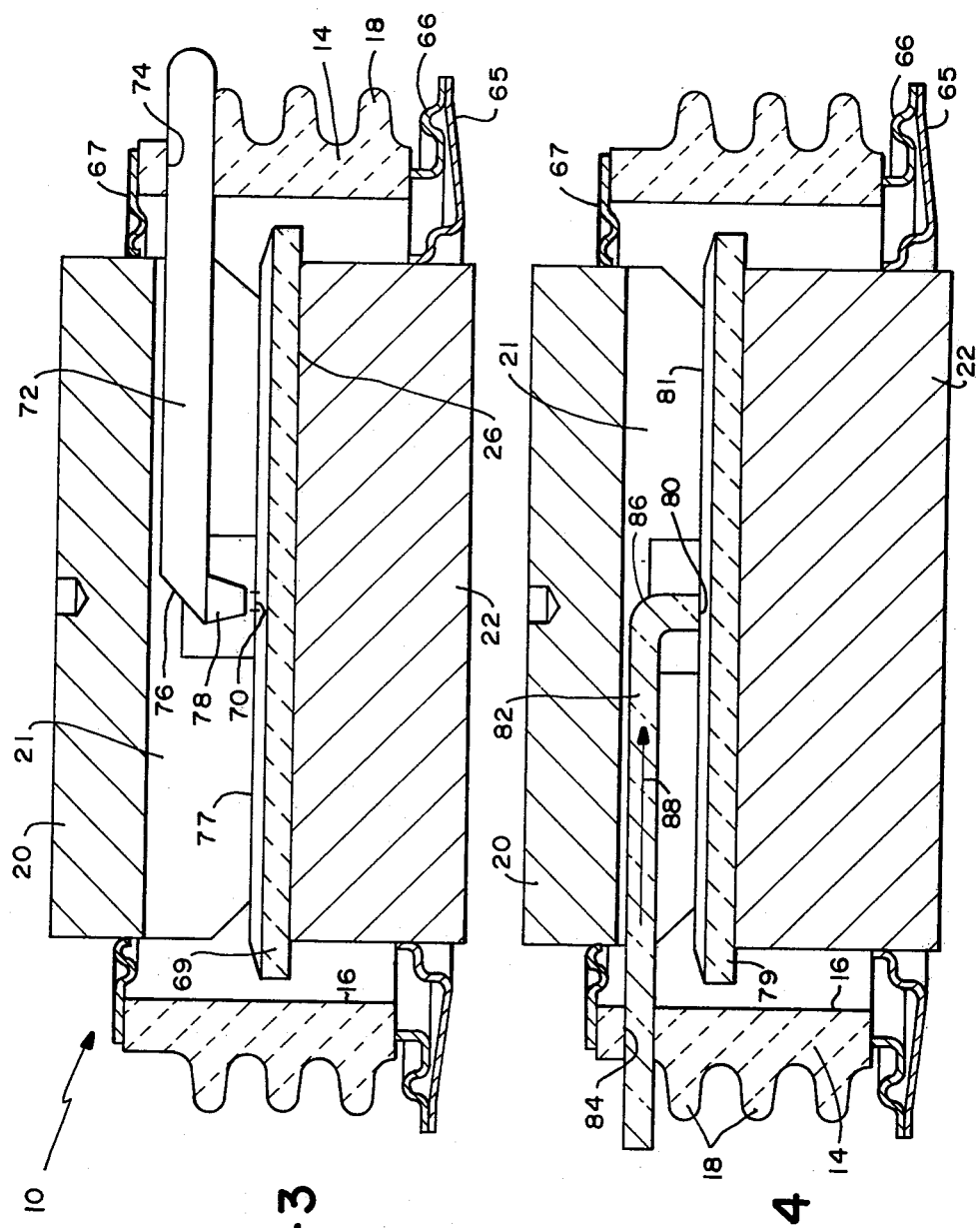

PACKAGE FOR RADIATION TRIGGERED SEMICONDUCTOR DEVICE AND METHOD

The invention relates generally to packages for semiconductor devices and more specifically to packages for switching devices such as thyristors which are radiation triggered.

Semiconductor switching devices are being increasingly used in the electric power generation and distribution industry for switching large currents. For example, high power thyristors can be used for AC/DC switching on high voltage direct current transmission lines. Thyristors used for this purpose are preferably radiation triggered to provide a high degree of electrical isolation in the triggering circuit. With radiation triggering, the triggering signal can be carried on an optical fiber, which is unaffected by line potential.

Thyristors designed to handle relatively large currents have particular packaging requirements which do not readily accommodate radiation triggering. High power thyristors are generally mounted in hermetically sealed packages which have relatively large contact surfaces. The packages are made to accommodate large compressive forces exerted by external clamps to insure reliable electrical connections between the thyristor and external circuitry. The thyristor devices within the packages are sealed and under compression, and are relatively inaccessible for receiving a radiation trigger signal from an external source.

An example of a package for an electrically fired semiconductor device which allows for externally-applied compression is found in Byczkowski, U.S. Pat. No. 4,008,486. Examples of packages for semiconductor devices which allow for radiation triggering are found in Roberts, U.S. Pat. No. 3,590,338, and U.S. Pat. No. 3,590,344. The Roberts packages are stud-mounted, and are not designed for externally-applied compression. An example of one prior art technique for packaging radiation triggered semiconductor devices in a package which allows for compression-mounting of the semiconductor device is found in Roberts, U.S. Pat. No. 3,796,881. In the U.S. Pat. No. 3,796,881 package an aperture bored through one of the pole pieces at an angle is fitted with a light pipe which delivers a radiation pulse to the device in the package. Such a construction has several disadvantages, including the difficulty of accommodating the different thermal expansion characteristics of glass and metal, and the inconvenient location of the light pipe on the top of the package where heat sinks and a clamp are usually located.

It is a general object of the present invention to provide an improved method and means for packaging radiation triggered semiconductor devices which have large power handling capacities.

Another object of the invention is to provide a package for a radiation triggered semiconductor device in which the triggering radiation entering the package is transmitted with minimal loss to the radiation sensitive region of the device in a relatively concentrated state for efficient triggering.

Another object of the invention is to provide an improved method for directing radiation to the radiation receiving region of a semiconductor device which is hermetically sealed in a package.

Accordingly, a package for a radiation triggered semiconductor device of the type including an enclosure having a side wall formed of an electrically insulating material surrounding a central cavity, and having top and bottom walls formed of conductive material which make electrical contact with electrodes on opposed surfaces of a semiconductor device in the cavity, is provided by the present invention. The package is of a hermetically sealable type constructed to withstand externally applied compression exerted on the top and bottom walls. The package includes optical conduit means extending through and hermetically sealed to the insulating side wall of the enclosure. The optical conduit means transmits radiation in the package along a first optical path. The optical conduit means includes means for directing radiation from the first optical path toward a predetermined region in the cavity whereby the radiation is directed to a specific portion of a radiation triggered semiconductor device in the cavity to trigger the device.

The method of the invention for directing radiation to a radiation receiving region of a semiconductor device mounted in the interior cavity of a package of the type described above, comprises the following steps: causing the radiation to enter the package through the insulating side walls of the enclosure; causing the radiation to be directed along a first optical path in the cavity; and then redirecting the radiation within the cavity from the first optical path toward a predetermined region on the semiconductor device to trigger the device.

A preferred embodiment of the invention is described in detail below with reference being made to the accompanying drawings, in which:

FIG. 1 is a cross-sectional view of a package for a semiconductor device according to the invention.

FIG. 2 is an alternative embodiment of the package of FIG. 1.

FIG. 3 is another alternative embodiment of a package as in FIG. 1.

FIG. 4 is another alternative embodiment of a package as in FIG. 1.

Referring to FIG. 1, the first embodiment of a package 10 for a radiation triggered semiconductor device 12 is shown. The package comprises an enclosure having a circular side wall 14 formed of an electrically insulating material, such as a ceramic, surrounding a central cavity 16. Circular ribs 18 are provided on the exterior surface of wall 14 to increase the surface resistance path. The top and bottom walls 20 and 22 of the package, respectively, are relatively thick, circular blocks formed of an electrically conductive material such as copper. The top and bottom walls serve as pole pieces to which external circuit connections are made. Top wall 20 includes a longitudinal slot 21 along its lower side adjacent device 12 to accommodate triggering means for the device. When the package is assembled, the top wall 20 makes electrical contact with an electrode 24 on the upper surface of device 12, and the lower wall 22 makes electrical contact with an electrode on the lower surface 26 of the device, in the manner well known in the art. Extending radially outwardly from top wall 20 is a flange 28 adapted to be joined to a similar flange 30 mounted on the top of side wall 14. The flanges are used to form an hermetical seal when the package is closed. A similar flange 32 extends radially outwardly from bottom wall 22 and is bonded to the lower surface of side wall 14. The flanges 28, 30, and 32 permit some relative movement between the pole pieces and side wall 14 to allow the package to withstand externally applied compression on the top and bottom walls.

Package 10 is adapted to receive a radiation triggered thyristor in cavity 16. Device 12, illustrated in FIG. 1, is a thyristor consisting of a predominantly silicon wafer having a radiation sensitive region 34 on the upper surface. The radiation sensitive region may be located centrally on the device, or near the edge as in FIG. 1. Most of the remainder of upper surface 24 is covered by the thyristor cathode electrode, to which upper pole piece 20 makes contact. Lower surface 26 is covered by the thyristor anode, to which lower pole piece 22 makes contact. Operation of the thyristor is conventional. With the anode forward biased relative to the cathode, current through the thyristor is blocked until the device is triggered by a sufficiently strong radiation pulse supplied to region 34. Upon triggering, the device conducts current with practically zero voltage drop until the blocking state is reestablished either by reversing the voltage across the device or by another method.

To admit light into the interior of the package for triggering the thyristor, an optical conduit 40 is provided, extending through and hermetically sealed to side wall 14. In the first embodiment of FIG. 1, conduit 40 includes a length of optical material, such as glass or a fiber optic material, which is sealed in any suitable manner within an opening 42 formed in the insulating side wall 14. The optical material extends into slot 21 in the top wall and terminates in a prismatic reflective surface 44. The prism reflects the incoming radiation downwardly toward radiation sensitive region 34 of the thyristor. Triggering radiation will enter the package and be transmitted along a first optical path 43 in optical material 40, and be redirected by reflective surface 44 toward a predetermined region in the package cavity 16. The thyristor 12 in the package is positioned so that the radiation receiving region 34 receives the triggering radiation pulse.

The prismatic reflecting surface 44 is substantially flat and inclined at forty-five degrees with respect to the optical path 43 along conduit 40. If the optical material used in conduit 40 is glass and the incoming radiation is coherent, total internal reflection will occur and virtually all the radiation will be reflected downwardly toward region 34. Surface 44 can be silvered to insure maximum reflection.

The package of the first embodiment is assembled by first placing thyristor 12 within cavity 16 with the lower surface 26 resting against lower pole piece 22. The thyristor is oriented so that radiation receiving region 34 is directly beneath the prismatic reflective surface 44 of optical conduit 40. The upper pole piece is then installed on top of the thyristor with slot 21 oriented parallel to optical conduit 40. The package is then evacuated or filled with a suitable inert gas, and hermetically sealed by bonding flanges 28 and 30 together by any suitable method such as brazing. In high power applications it is customary to provide metal heat sinks adjacent the upper and lower pole pieces 20 and 22 and an external mounting clamp of any conventional type (not shown). External circuit connections are made to the pole pieces. A source of triggering radiation (not shown) is connected to the external end of optical conduit 40. A suitable fiber optic coupling means to which a fiber optic cable can be connected would serve this purpose.

The package accomplishes the method of the present invention for directing radiation to the radiation receiving region of a semiconductor device mounted within an hermetically sealed package. Radiation from a suitable source is caused to enter conduit 40, whereupon it passes through the insulating side wall 14 and into cavity 16 where the radiation is directed along a first optical path 43. Inside the cavity 16 of the package the radiation is redirected from first optical path 43 toward the radiation receiving region of the semiconductor device to trigger the device. In the first embodiment the radiation is redirected by causing the radiation to strike reflective surface 44, which transmits substantially all the radiation toward region 34 of the thyristor. By redirecting the radiation within the package cavity, the radiation is able to enter the package at a convenient location along the side wall, rather than through the top of the package. Once inside the package, the radiation is redirected approximately ninety degrees, where it strikes the radiation receiving region of the thyristor approximately perpendicularly.

The package allows for radiation triggering of a thyristor without interfering with the application of an external clamp on the top and bottom walls of the package. As such, the package is particularly suitable for high power applications where both clamping of the package and electrical isolation of the trigger circuit is desirable. Furthermore, the optical conduit is located conveniently for making the connection to an external source of triggering radiation. Since the optical conduit does not pass through a pole piece, glass-to-metal seals are avoided. The prismatic surface within the package will redirect virtually all the incoming radiation directly onto the radiation receiving region of the device with a minimum of scattering. Furthermore, the light arrives at the radiation receiving region almost perpendicularly, affording maximum penetration and more efficient device turnon.

Referring to FIG. 2, an alternative embodiment of the invention is shown. The package of FIG. 2 includes the same basic structural features as the package of FIG. 1, and the same reference numbers are used for like parts. The thyristor 49 mounted in the package of FIG. 2 is a radiation-responsive thyristor having a radiation receiving region 50 centrally disposed on upper surface 51. In this embodiment, the optical conduit for bringing radiation from outside the package to region 50 includes an optical member 52 which has a parabolic reflective surface 54 at one end adjacent region 50. The parabolic reflective surface serves to simultaneously redirect and focus the radiation which is transmitted into the package cavity, giving a more intense, localized radiation trigger pulse. Surface 54 has either a spheroidal or cylindrical parabolic shape.

In the embodiment of FIG. 2, optical member 52 is preferably affixed directly to top surface 24 of the thyristor by clear epoxy or the like to assure proper positioning and orientation. A separate piece of optical conduit 56 is mounted in an opening 58 in package wall 14 to provide the radiation path into the package. Preferably, a short piece of flexible light pipe 60 is used to couple optical member 52 and conduit 56 to assure maximum transmission of the radiation into member 52 and to correct for any misalignment of member 52 and conduit 56. The piece of flexible light pipe 60 can be eliminated if proper alignment of member 52 and conduit 56 proves feasible.

When firing a thyristor device mounted in a package as shown in FIG. 2, the radiation will be transmitted through conduit 56 and piece 60 to optical member 52, and travel therein along a first optical path 62 to parabolic reflective surface 54. The parabolic surface will simultaneously reflect and focus the radiation, directing it toward a relatively small region 50 on the surface of the thyristor. The radiation enters the package through conduit 56 along a second optical path 64, which may or may not be precisely colinear with first optical path 62. As such, the radiation in member 52 will probably be somewhat more randomly oriented than in conduit 40 of the first embodiment, and it is advisable to silver the surface of member 52 to prevent excessive losses due to scattering.

Like the first embodiment, the embodiment of FIG. 2 provides a convenient method of firing a radiation triggered thyristor which is compressed mounted in a sealed package. Because the embodiment of FIG. 2 focuses the radiation, higher radiation intensities are achieved over a localized region in the package. This can be a significant advantage when firing thyristors which require relatively high-intensity trigger pulses, such as thyristors in which gate sensitivity has been sacrificed in order to achieve other design objectives.

Another alternative embodiment of the invention is shown in FIG. 3. Like the first embodiment, the package of FIG. 3 includes a circular side wall 14 formed of electrically insulating material surrounding a central cavity 16. Top and bottom walls 20 and 22 are the same as in the first embodiment, although the position of the assembly flanges are reversed. In FIG. 3, bottom wall 22 is removable instead of top wall 20. Therefore, a flange 65 is provided extending radially outwardly from bottom wall 22 which is adapted to be joined to a cooperating flange 66 mounted on the bottom of side wall 14. An attaching member 67 is provided on the top of wall 14 which is joined to top wall 20. The remaining elements of the embodiment of FIG. 3 are the same as in the first embodiment and the same reference numbers are used for like parts.

The thyristor 69 shown in FIG. 3 has a centrally disposed radiation receiving region 70. The optical conduit 72 in this embodiment extends through and is hermetically sealed to an opening 74 in the side wall 14 of package 10. Conduit 72 terminates in a flat prismatic surface 76 inclined at approximately forty-five degrees. The conduit of this embodiment includes a different focusing means from the embodiment of FIG. 2 in the form of an additional focusing element 78 disposed in the path of redirected radiation below prismatic surface 76. Any suitable type of focusing means can be used for element 78. One suitable focusing means consists of fiber optic material containing a predetermined pattern of diffused impurities which produces a variation in the refractive index of the material to cause a focusing effect. An example of such a material is "Sel-Foc" (trademark) manufactured by Nippon Electric.

The package of FIG. 3 is assembled by placing thyristor 69 in cavity 16 with the upper surface 77 against the upper pole piece 20. Radiation receiving region 70 is positioned directly beneath focusing element 78. The package is then sealed by bonding flanges 65 and 66 together by any suitable method such as brazing. External connections are made as in the first embodiment. The lower pole piece 22 is made removable in the package of FIG. 3 to permit the optical conduit 72 to be mounted in the package before the thyristor is installed.

Light entering the package of FIG. 3 is transmitted along the length of optical material 72, which forms a first optical path, and strikes prismatic surface 76. The prismatic surface redirects the radiation downwardly, where it passes through focusing member 78 and is concentrated before passing to region 70 on the surface of thyristor 69. This embodiment produces the advantage of focusing of the radiation, as with the embodiment of FIG. 2, but requires somewhat simplified assembly because bonding of the optical material directly to the thyristor is not required. Also, because the light is redirected by a flat prismatic surface, scattering and radiation losses will be relatively low.

Another alternative embodiment of the invention is shown in FIG. 4. This embodiment includes the same essential package features as in the embodiment of FIG. 3, and the same reference numbers are used for like parts. The thyristor 79 shown in FIG. 4 has a centrally disposed radiation receiving region 80 on top surface 81 of the thyristor. A length of optical fiber is used in this embodiment for an optical conduit to bring triggering radiation to the radiation receiving region. The optical fiber extends through and is hermetically sealed into an opening 84 in side wall 14 of the package. A ninety-degree bend 86 is incorporated into the optical fiber to redirect the radiation downwardly toward radiation receiving region 80 of the thyristor.

Light entering the embodiment shown in FIG. 4 passes through optical fiber 82 along a first optical path 88 until it reaches bend 86. At the bend the radiation strikes the side walls of the fiber and through random multiple reflections is redirected downwardly in a manner well known in the art of fiber optics. There will generally be greater loss of radiation due to scattering in the embodiment of FIG. 4 as compared with the other embodiments, particularly as compared with those of FIGS. 1 and 3. This is due to the inherently uncontrolled angles of reflection within the optical fiber. These losses can be abated somewhat by silvering the outside surface around bend 86. The advantage of the embodiment of FIG. 4 is that it is relatively simple to assemble and the optical fiber used is relatively inexpensive.

The present invention is particularly well adapted to the packaging of high power thyristors which are radiation triggered. The package can be compression mounted and the radiation enters the package at a convenient location on the side of the package. The radiation is transmitted directly to the location of the radiation receiving region of the thyristor with little loss. The embodiments of FIGS. 1 and 3, which incorporate flat prismatic surfaces, are particularly efficient at redirecting the radiation downwardly with practically zero loss. The invention provides means for focusing the radiation for use with thyristors requiring an intense trigger pulse.

Alternative semiconductor packages are possible within the scope of the invention. For example, the devices shown have radiation receiving regions either at the edge or the center of the upper surface, and all the embodiments can be made to accommodate both edge and center triggered devices. The first embodiment can be modified to deliver the radiation to the center of the device by simply increasing the length of the prism so that it extends to the center of the package. Alternate types of focusing devices could be employed with the embodiment of FIG. 3. A focusing element could be added to the embodiment of FIG. 4. The prisms and optical conduits employed can be either circular, rectangular, or any other suitable shape.

An improved method and means for packaging high power radiation triggered semiconductor devices has been provided. The invention provides a package for a radiation triggered semiconductor device in which the triggering radiation is transmitted with minimal loss to the radiation sensitive region of the device in a relatively concentrated state for efficient triggering. The invention also provides an improved method for directing radiation to the radiation receiving region of a semiconductor device which is hermetically sealed in a package.

What is claimed is:

1. A package for a radiation triggered semiconductor device including an enclosure having a side wall formed of an electrically insulating material surrounding a central cavity, and top and bottom walls formed of conductive material which make electrical contact with electrodes on opposed surfaces of a semiconductor device in said cavity, said package being hermetically sealable and constructed to withstand externally applied compression exerted on the top and bottom walls, said package further comprising: optical conduit means extending through and hermetically sealed to the insulating side wall of said enclosure and transmitting radiation in said package along a first optical path, said optical conduit means terminating in a reflective surface such surface redirecting radiation from said first optical path toward a predetermined region in said cavity whereby the radiation is directed to a specific portion of a radiation triggered semiconductor device in said cavity to trigger the device.

2. A package as in claim 1 in which said optical conduit means includes a prism and said reflective surface is a substantially flat prismatic surface in said cavity.

3. A package as in claim 2 in which said prismatic surface is inclined approximately forty-five degrees with respect to said first optical path to cause incoming radiation in said optical path to be redirected approximately ninety degrees.

4. A package as in claim 1 in which said optical conduit means includes a length of optical material along said first optical path, and said reflective surface includes a substantially flat prismatic surface formed on said optical material and inclined approximately forty-five degrees with respect to said first optical path, including a focusing member in the path of the redirected radiation for concentrating incoming radiation before passing the radiation to said predetermined region in said cavity.

5. A package as in claim 4 in which said focusing means includes additional optical material which contains a predetermined pattern of diffused impurities producing a variation in the refractive index of said optical materials to cause focusing of the radiation.

6. A package as in claim 1 in which said reflective surface is parabolic and simultaneously reflects and focuses incoming radiation toward said predetermined region in said cavity.

7. A package as in claim 6 in which said optical conduit means includes an optical member extending along said first optical path, said parabolic reflective surface being formed at one end of said optical member.

8. A package as in claim 7 in which said optical member is fixed in said cavity relative to a semiconductor device therein, said optical conduit means further including a length of optical conduit carrying incoming radiation along a second optical path from outside said enclosure, said optical conduit being coupled to said optical member in said cavity whereby substantially all radiation entering said package along said second optical path is transmitted to said optical member.

9. A package as in claim 1 in which said optical conduit means includes means for focusing radiation to increase the intensity of the radiation directed to said predetermined region in said cavity.

10. A method for directing radiation to a radiation receiving region of a semiconductor device mounted in the interior cavity of a package, the package having side walls formed of an electrically insulating material surrounding the cavity, and top and bottom walls formed of conductive material which make electrical contact with electrodes on opposed surfaces of the semiconductor device, said package being hermetically sealable and constructed to withstand externally applied compression exerted on said top and botom walls, the method comprising the steps of: causing radiation to enter said package through the insulating side walls of the enclosure, causing said radiation to be directed along a first optical path in said cavity, and redirecting radiation within said cavity from said first optical path toward a predetermined region on said semiconductor device to trigger said semiconductor device by causing such radiation to strike a reflective surface.

11. A method as in claim 10 in which said step of causing said radiation to strike a reflective surface includes causing said radiation to strike a prismatic surface inclined approximately forty-five degrees with respect to said first optical path to produce an approximately ninety-degree turn in the path of said radiation.

12. A method as in claim 11 including the additional step of focusing the redirected radiation to increase the intensity of the radiation directed to said predetermined region on said semiconductor device.

13. A method as in claim 10 in which said reflective surface is parabolic and said step of redirecting said radiation includes simultaneously redirecting said radiation from said first optical path and focusing said radiation upon striking said parabolic reflective surface.

* * * * *